United States Patent
Vertregt et al.

[11] Patent Number: 5,929,842
[45] Date of Patent: Jul. 27, 1999

[54] METHOD AND APPARATUS FOR IMPROVING TIME VARIANT IMAGE DETAILS ON A RASTER DISPLAY

[75] Inventors: Maarten Vertregt; William Rey, both of Eindhoven, Netherlands

[73] Assignee: Fluke Corporation, Everett, Wash.

[21] Appl. No.: 08/692,833

[22] Filed: Jul. 31, 1996

[51] Int. Cl.$^6$ ...................................................... B06F 7/00
[52] U.S. Cl. .......................................... 345/147; 345/132
[58] Field of Search ................................. 345/147, 88, 87, 345/77, 63, 53, 35, 20, 13, 23, 134, 132, 89

[56] References Cited

U.S. PATENT DOCUMENTS

| | | | |
|---|---|---|---|
| 3,621,214 | 11/1971 | Romney | 340/324.1 |
| 4,547,797 | 10/1985 | Mick | 358/27 |
| 5,142,616 | 8/1992 | Kellas et al. | 395/135 |
| 5,532,716 | 7/1996 | Sano | 345/132 |

OTHER PUBLICATIONS

"Digital scopes boast analog acquisition rates", IEEE Spectrum magazine, Nov. 1994, p. 101.
"Tektronix Measurement Products Catalog 1995", Tektronix, Inc., 1994, pp. 54–57.

Primary Examiner—Mark R. Powell
Assistant Examiner—Mansour Said
Attorney, Agent, or Firm—George T. Noe

[57] ABSTRACT

A method of displaying digital samples with enhanced image details on a raster display using a limited set of brightness values is provided. Digital samples are interpolated and stored as pixel information in high resolution intensity memory. An adaptive mapping process maps the high resolution intensity information to low intensity brightness information in a manner so as to maximize image details. An equal number of brightness levels from light to dark are allocated in each column along the sweep. An adaptive recombination process combines past and present brightness information in a manner that best preserves image details when the temporal behavior of the display image is changing. A raster display device is employed to display the image which is stored in the display memory as pixels arranged by row and column.

33 Claims, 8 Drawing Sheets

(PRIOR ART)

SUM

State 1 | Present
Past |  | 1 | 2 | 3
---|---|---|---|---
 | 0 | 1 | 2 | 3
 | 1 | (2) | 2 | 3
 | 2 | 2 | 2 | 3
 | 3 | 3 | 3 | 3

State 2 | Present
Past |  | 1 | 2 | 3
---|---|---|---|---
 | 0 | 1 | 2 | 3
 | 1 | 1 | 2 | 3
 | 2 | 2 | 2 | 3
 | 3 | 3 | 3 | 3

FIG. 10B

DECREMENT PAST

State 3 | Present
Past |  | 1 | 2 | 3
---|---|---|---|---
 | 0 | 1 | 2 | 3
 | 1 | 1 | 2 | 3
 | 2 | 2 | 2 | 3
 | 3 | (2) | (2) | 3

FIG. 10C

INTERMEDIATE

State 4 | Present
Past |  | 1 | 2 | 3
---|---|---|---|---
 | 0 | 1 | 2 | 3
 | 1 | 1 | 2 | 3
 | 2 | 2 | 2 | 3
 | 3 | (2) | 3 | 3

FIG. 10D

METHOD AND APPARATUS FOR IMPROVING TIME VARIANT IMAGE DETAILS ON A RASTER DISPLAY

BACKGROUND OF THE INVENTION

This invention relates generally to electronic display systems and in particular to a method and apparatus for displaying signal information with improved image details on a raster display having limited brightness levels in an electronic measurement instrument.

Oscilloscopes are a form of test and measurement instrument that has been used for many years to measure and display electrical signals as graphical waveforms. Oscilloscopes have been traditionally divided into two classes, analog and digital, based on the technology used in the instrument. The method of measuring and displaying electrical signals between these analog and digital classes of technology is very different and each technology has its own attendant advantages and disadvantages. An electrical signal to be measured is coupled to an input terminal of the measurement instrument and becomes an input signal.

Analog oscilloscopes measure and display the input signal by displacing an electron beam vertically as a function of the amplitude of the electrical signal as the beam is swept from one side of a cathode ray tube (CRT) to the other at a sweep rate. The pattern that is traced out on the phosphor of the CRT is integrated in the eyes of the oscilloscope user which allows the entire waveform to be seen. The CRT phosphor is selected to have a persistence time long enough to permit this integration over a wide range of sweep speeds.

Analog oscilloscopes tend to have a high measurement duty cycle. Measurement duty cycle is the ratio of measurement time to the time spent processing the measurement and is also known as "dead time." Most of the dead time of the analog oscilloscope is the time during which the electron beam is returned from the end of a sweep back to the beginning to start another sweep. It is desirable to have a high measurement duty cycle in order to display as much measurement information as possible because any information from the input signal that arrives during the dead time is lost. At higher sweep rates, the display of the analog oscilloscope is updated very rapidly, thereby giving the displayed waveform a "live" look that provides the ability to reveal a great deal of information about the input signal to the user, particularly in situations involving complex input signals which have considerable variation over a given measurement time. The ability to display a large amount of information about the input signal with a high measurement duty cycle tends to make the analog oscilloscope a good qualitative tool.

Digital storage oscilloscopes, (DSO's), operate by digitizing the input signal into discrete digital samples using an analog to digital converter (ADC), storing the digital samples in trace memory, and then converting the digital samples into graphical traces in a trace memory for subsequent display as a graphical image, typically on a raster display. A raster display typically uses a two dimensional array or matrix of picture elements (pixels) arranged in rows and columns, with each pixel assigned a brightness value. A typical raster display has hundreds of rows and columns with which to construct a display image with the raster display update rate being independent of the sweep or measurement rate.

DSO's have an advantage over analog oscilloscopes by having the ability to store, recall, and perform calculations on the stored digital samples. As such, DSO's tend to be good quantitative tools for accurately measuring voltage and time characteristics of the input signal. However, the measurement duty cycle of DSO's, along with the update rate, tends to be substantially lower than that of analog oscilloscopes. In a DSO, the full measurement speed is only available when the trace memory is being filled while the remaining time is dead time in which the digital samples are processed. The DSO, therefore, while a good quantitative tool, tends to be not as good for use as a qualitative tool for visualizing the real time behavior of the input signal because of its relatively low measurement duty cycle.

A single acquisition of the input signal over a predetermined acquisition time captures a view of the electrical signal in the spatial domain, which is the amplitude variation of the input signal versus acquisition time. A complex electrical signal may have variations over multiple acquisitions in the temporal domain which is amplitude variation versus acquisition number. Thus, the changing character of the electrical signal in the temporal domain may be captured over multiple acquisitions which are stored as the display image. The display image is thus a function of acquisition time, which remains constant, and temporal time, which is as long as desired and measured in the terms of the number of acquisitions.

A new DSO measurement architecture has recently emerged that substantially improves the update rate and measurement duty cycle. In this architecture, digital samples are converted directly to pixel information as quickly as they arrive from the ADC to build a display image over numerous acquisitions. The display image, because of its increased measurement duty cycle, more closely resembles the traditional analog oscilloscope in providing a qualitative image of the electrical signal.

However, because the display image is stored only in the form of pixel information and not in terms of actual measurement values, the qualitative value of the display image is reduced because precise measurements are no longer possible. Because the multiple acquisitions must be mapped onto a limited set of pixels in the raster display with each pixel having a limited set of brightness levels, various methods have been devised for building the display image while preserving the temporal information over multiple acquisitions of the electrical signal. Prior art DSO's typically use false color to represent the frequency of which any particular pixel has been accessed over multiple acquisitions. In this way, transient signals and infrequent anomalies may be highlighted with a different color from that of a repetitious signal having substantially the same temporal behavior over multiple acquisitions.

DSO's are increasingly being designed as portable, handheld, battery-operated instruments, often using liquid crystal display (LCD) technology. Readily-available LCD technology effectively provides only four levels of brightness, typically in a monochrome LCD display. Power consumption, physical size, and LCD display brightness and resolution are critical factors in the design of a portable DSO. At the same time, there is a substantial need for DSO's to adopt the advantages of their analog oscilloscope counterparts in having relatively high update rates and the ability to perceive structural details of complex input signals with high variation in the temporal domain. It would be therefore be desirable to provide an improved method of displaying the temporal domain image of an electrical signal with enhanced image details using a limited number of brightness levels for each pixel using adaptive processes that select allocate the pixels to each of the brightness levels by predetermined portions within each column of each sweep.

It would be further desirable that the present brightness levels be adaptively combined with past brightness levels to effectively display a composite signal based on both the present and past signal characteristics.

SUMMARY OF THE INVENTION

In accordance with the present invention, a method of displaying digital samples in the form of a raster display image with enhanced image details using a limited set of brightness values is provided. A raster display device is employed to display the image which is stored in display memory as pixels arranged by row and column. Digital samples are stored in intensity memory which is typically mapped to the rows and columns of the raster display.

Digital samples taken from an input signal which is present at a set of input terminals of a DSO arrive at a relatively high sample rate. Each trigger event creates a sweep of samples across the columns of the intensity memory. Within each column, the digital samples are interpolated and stored as pixel information in the high resolution intensity memory.

An adaptive mapping process maps the high resolution intensity information to low intensity brightness information for storage in a display memory in a manner so as to maximize image details. An equal number of pixels from each of the four brightness levels from light to dark are allocated in each column along the sweep in an adaptive manner depending on the distribution of intensity information.

An adaptive recombination process combines past and present brightness information in a manner that best preserves image details when the temporal behavior of the input signal is changing. A composite indicator is developed based on the past pixel information previously stored in the brightness memory. The present and past brightness information is combined in a manner governed by the composite indicator so as to most effectively preserve image details.

A raster display device is employed to display the image which is stored as brightness levels in the display memory as pixels arranged by row and column. In the preferred embodiment, the raster display device is a liquid crystal display (LCD) having four brightness levels ranging from white, light gray, dark gray, to black.

One object of the present invention is to provide a method of displaying enhanced image details on a raster display.

Another object of the present invention is to provide a method of displaying enhanced image details on a raster display having a limited number of brightness levels.

An additional object of the present invention is to provide a method of displaying enhanced image details on a raster display using an adaptive algorithm to combine past and present display images.

A further object of the present invention is to provide a raster display system for displaying improved image details using adaptive algorithms to map intensity to brightness information and to combine past and present brightness information.

Other features, attainments, and advantages will become apparent to those skilled in the art upon a reading of the following description when taken in conjunction with the accompanying drawings.

DETAILED DESCRIPTION OF THE INVENTION

Figure 1A:
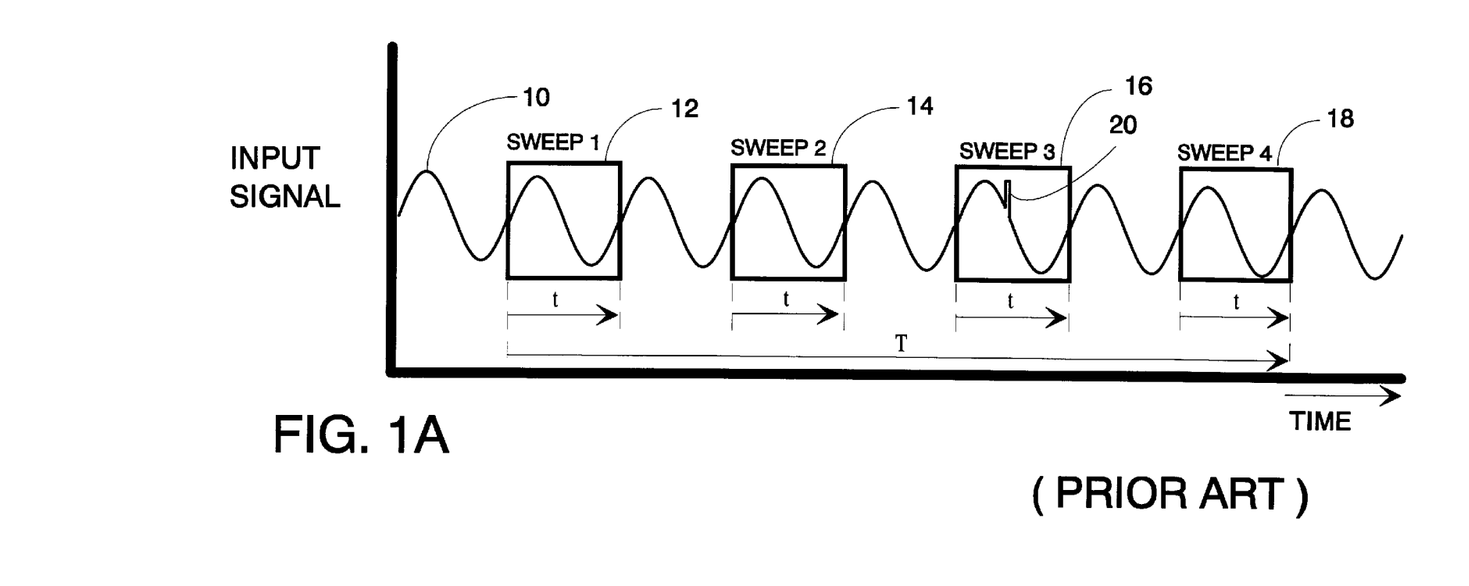
FIG. 1A and 1B together comprise an illustration of the process of measuring, combining, and displaying an input signal as a raster display image according to the prior art.

Referring now to FIG. 1, there is shown an input signal 10 which is illustrated as a sine wave signal for purposes of example. Most oscilloscopes, analog or digital, are capable of displaying the sine wave signal because there is relatively slow variation in the temporal domain. A series of sweeps 12, 14, 16, and 18, each with a sweep time t, are conducted sequentially during the overall measurement time T for a total sweep time of 4 t. The time between each of the sweeps 12, 14, 16, and 18 is dead time. The ratio of sweep time to overall measurement time is the measurement duty cycle.

$$\text{Measurement Duty Cycle} = \left[\frac{4 \cdot t}{T}\right]$$

If the input signal 10 has a transient event 20 as shown, it is desirable that the oscilloscope have as high a duty cycle as possible to maximize the chance of capturing the transient event 20.

Figure 1B:
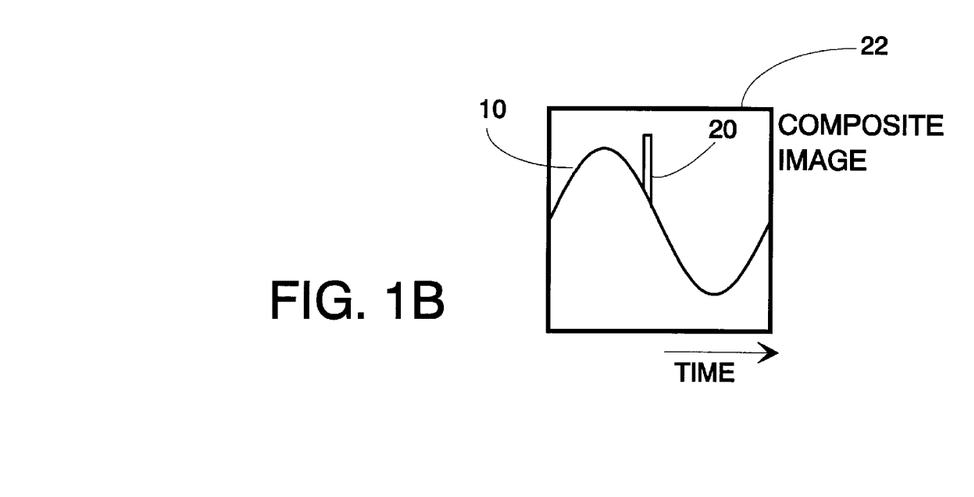

FIG. 1B illustrates a raster display image that shows a composite display image 22 of the input signal 10 as captured by the sweeps 12, 14, 16, and 18. As will be further discussed below, various oscilloscope technologies may be used to combine the images captured by the sweeps 12, 14, 16, and 18 to form the composite display image 22. The transient event 20 may be highlighted as a temporal variation using the available brightness levels of the display.

Figure 2:
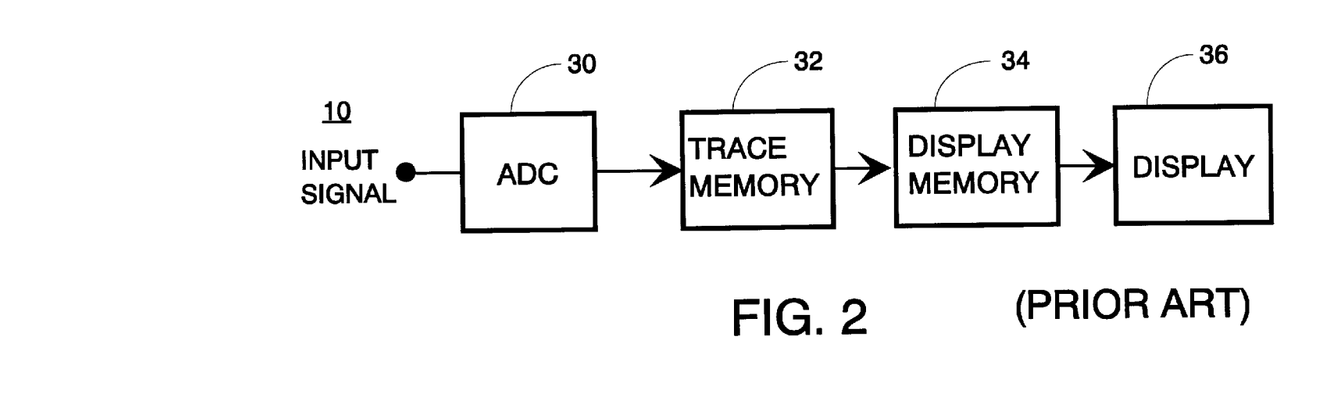
FIG. 2 is a block diagram of a digital storage oscilloscope according to the prior art.

FIG. 2 is a simplified block diagram of a digital storage oscilloscope (DSO) according to the prior art. The input signal 10 is coupled to an analog to digital converter (ADC)

30 which produces a series of digital samples which are stored in a trace memory 32. After an entire trace has been collected as a sweep, the trace information is processed into pixel information and transferred to a display memory 34 and the trace appears on a display 36 as a graphical trace. This method of measurement and display, often derived using repetitive digital sampling techniques, provides a detailed waveform display of the input signal 10 in the spatial domain but with a relatively low duty cycle. If the input signal 10 is not repetitive or is complex in nature and having a large amount of temporal variation, this method suffers because a substantial amount of signal information is lost during the dead time.

Figure 3:
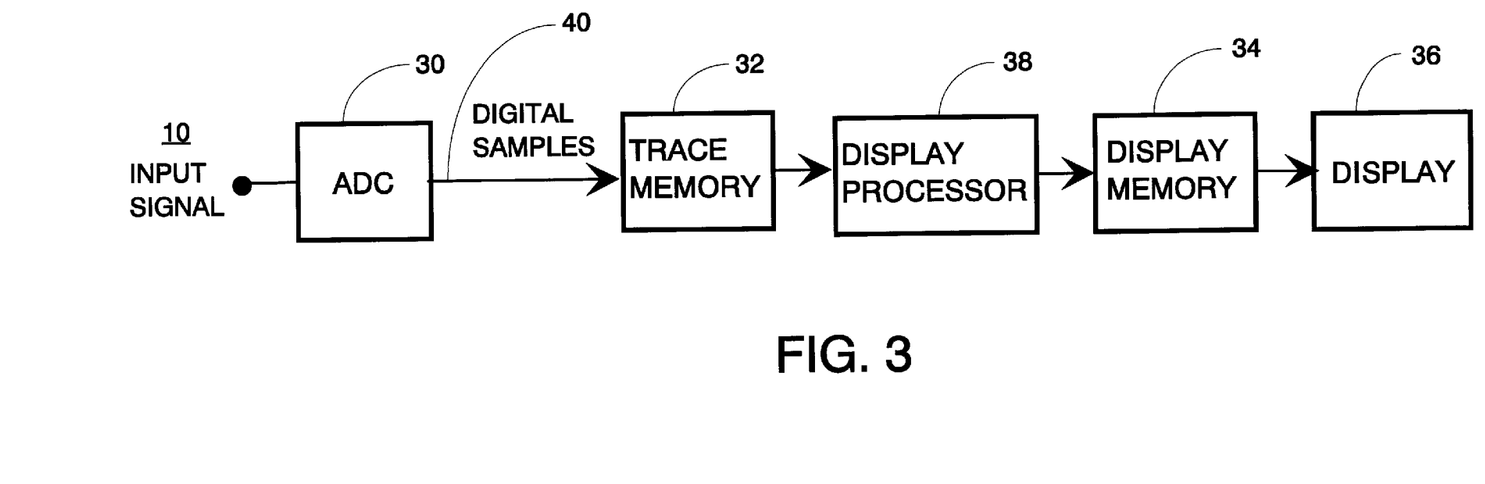
FIG. 3 is a block diagram of a digital storage oscilloscope incorporating a display processor with a method of displaying enhanced image details according to the present invention.

FIG. 3 is a simplified block diagram of a DSO which adds a display processor 38 after the trace memory 32 according to the present invention. The input signal 10 is coupled to the ADC 30 which provides digital samples 40 to the display processor 38. The display processor 38 operates to convert the digital samples 40 via the trace memory 32 into pixel information as the digital samples 40 arrive which is placed into the display memory 34 for display on the display 36. The display processor 38 operates on the pixel information derived from multiple sweeps to display the composite image 22 in enhanced detail according to the present invention as explained in further detail below.

Figure 4:
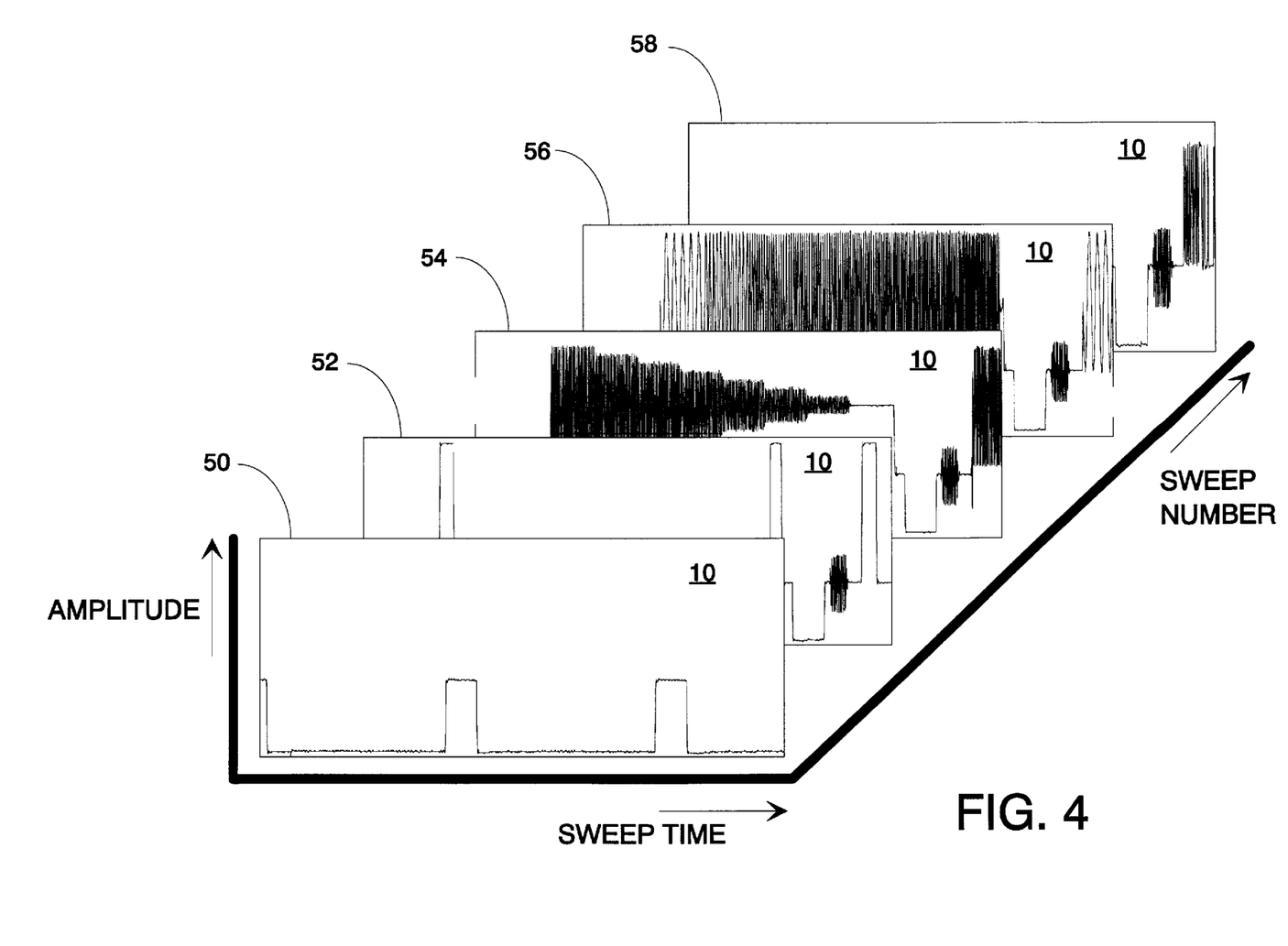
FIG. 4 is a three-dimension representation of a typical complex signal in the form of a video test signal which may be displayed with enhanced image details according to the present invention.

FIG. 4 is a three dimensional representation of an input signal 20 in the form of a video test signal as measured over multiple sweeps. Video signals, containing synchronization pulses, chrominance information, and luminance information, are typical of complex signals often measured by the oscilloscope. A complete video frame comprises 525 video lines in the North American NTSC standard or 625 video lines in the European PAL standard. Within the video frame, a large amount of temporal variation among the video lines is possible. It is desirable that as much information as possible about the temporal domain variation within the overall video frame be displayed.

Sweeps 50, 52, 54, 56, and 58 graphically depict a representative sample of the types of video lines that may be encountered within a single video frame. The sweep of the measurement instrument is synchronized to measure each video line separately. In the sweep 50, 52, 54, 56, and 58 are defined by amplitude versus sweep time. Along the sweep number axis, the sweeps 50, 52, 54, 56, and 58 are sequentially measured and combined to form the composite image 22. The sweep number axis thus represents the temporal variation of the input signal over time.

Figure 5:
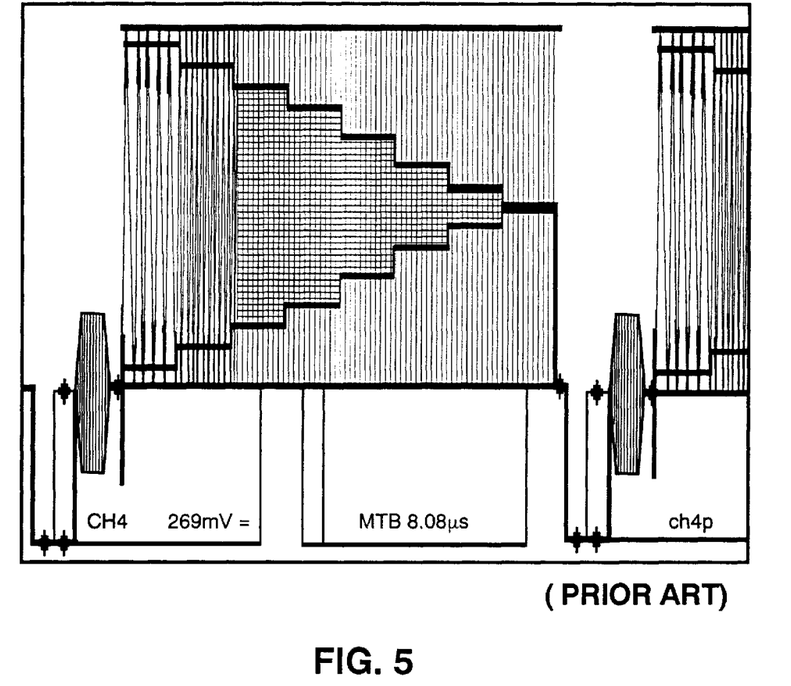
FIG. 5 is an illustration of the video test signal of FIG. 4 as would be displayed on a typical analog oscilloscope according to the prior art.

FIG. 5 is an illustration of the input signal 10 of FIG. 4 in the form of a video test signal over an entire video frame as would typically be displayed on an analog oscilloscope according to the prior art. The analog oscilloscope has an advantage of being able to display a relatively complex structure with a relatively high amount of temporal variation comprising the multiple sweeps of the input signal 10 and thus conveys a substantial amount of information about the input signal 10 to the oscilloscope user.

Figure 6:
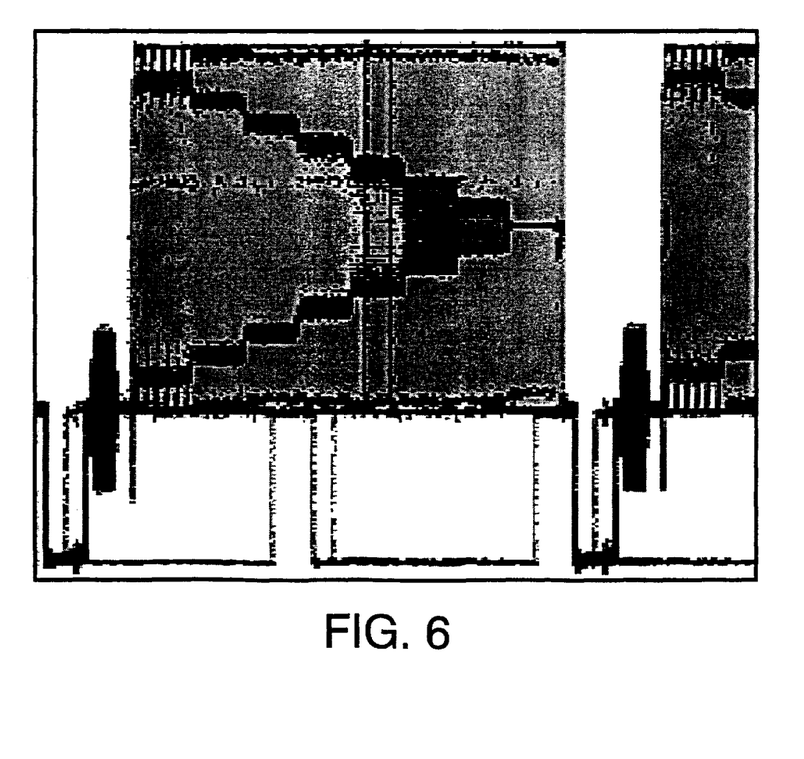
FIG. 6 is a raster display image of the video test signal of FIG. 4 as measured by the digital storage oscilloscope and displayed with enhanced details according to the present invention.

FIG. 6 is a composite display image as developed over multiple sweeps on a raster display of a DSO incorporating a display processor operating according to the present invention. The display processor 38 (shown in FIG. 3) develops an enhanced image which more clearly shows the variations in the temporal variations in the input signal 10 by allocating the limited brightness levels among the pixels of a raster display in an optimal manner using the first and second adaptive processes. As illustrated, the raster display has four brightness levels including white, light gray, dark gray, and black. The raster display must have at least two brightness levels in order for the invention to operate and preferably more than two. Color may be used to indicate brightness levels and the invention may be readily adapted to take advantage of color displays.

The relatively high measurement duty cycle allows more information to be captured from the input signal 10. In the preferred embodiment of the present invention, the composite display image of FIG. 6 more closely resembles the oscillograph of FIG. 5 and, as implemented in a DSO using a display processor 38, allows more of the image details to be displayed on a display having limited brightness levels. The first and second adaptive processes in the display processor 38 provide for the optimal use of the limited brightness levels of the display 36 in order to more clearly show the structure of the input signal 10 as discussed in further detail below.

Figure 7:
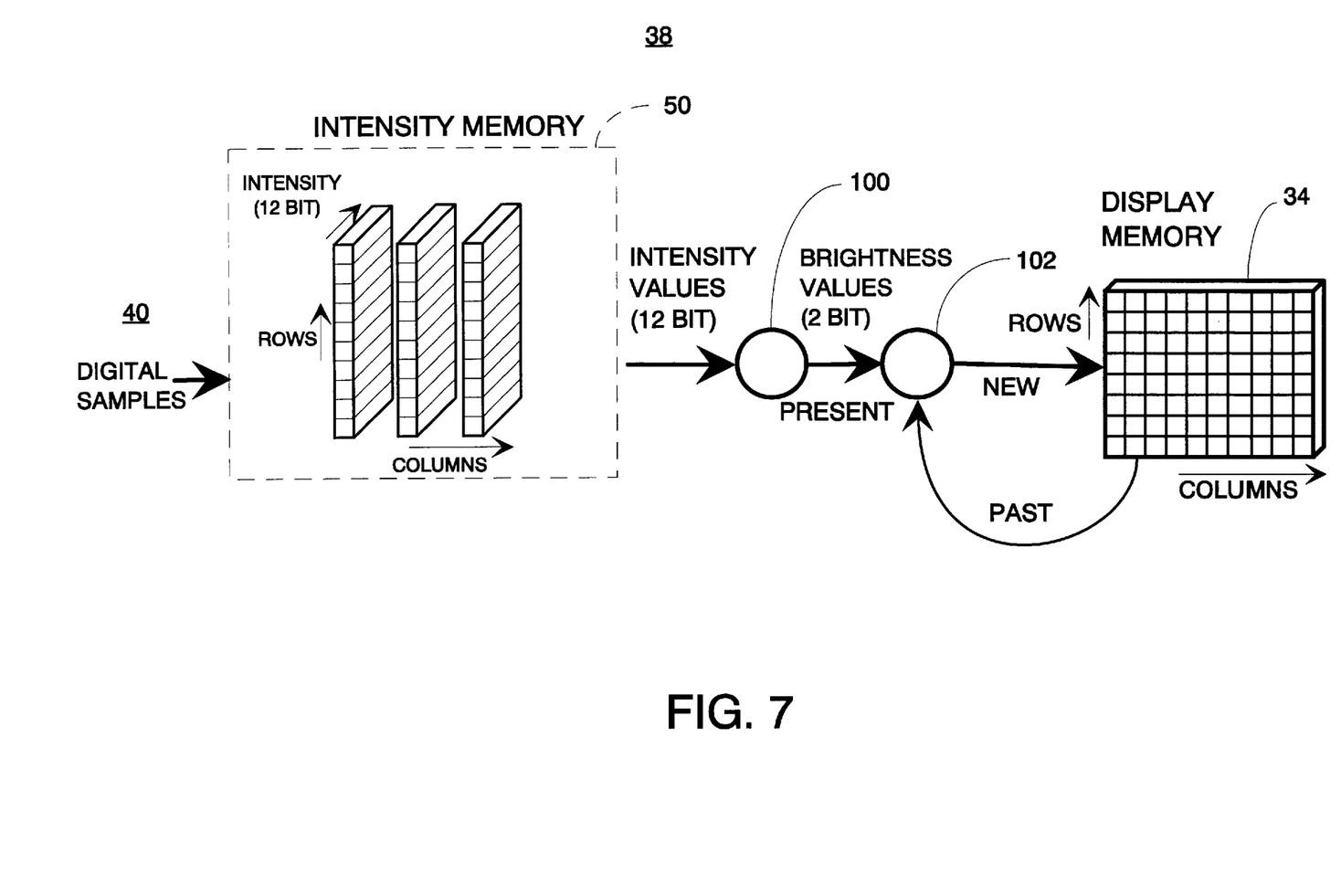
FIG. 7 is a block diagram of the display processor of FIG. 3 according to the present invention incorporating first and second adaptive processes.

Referring now to FIG. 7, there is shown a more detailed block diagram of the display processor 38 and display memory 34 shown in FIG. 3 according to the present invention. The digital samples 40 are from the ADC 30 in the preferred embodiment and are converted to difference values between the samples in order to capture the speed of change of signal amplitude over the acquisition time in the spatial domain. The digital samples 40 may also originate from any type of digital source such as stored waveforms or another type of measurement front-end such as a frequency counter-timer that is amenable to graphical display over multiple sweeps and sharing a common sweep time. The digital samples 40 may also arrive in the form of measurement values rather than difference values, depending on the needs of the application.

The digital samples 40 arrive at an intensity memory 50 which is arranged by rows and columns, with intensity bins arranged vertically within each column. Each intensity bin serves to store up to a predetermined amount of digital samples 40 which are assigned to an intensity bin. An interpolation process (not shown) may be employed to assign each digital sample 40 to a particular column and row within the intensity memory 50.

In the preferred embodiment, each intensity bin may store up to $2^{12}$ (12 bits) of intensity information. Greater or fewer numbers of bits may be chosen for the intensity bins depending on the available memory capacity and component cost as well as the dynamic range needed to preserve desired information about the input signal 10. During a sweep, a predetermined number of digital samples 40 are collected, depending on the sample rate of the ADC 30, and allocated to the intensity bins within the column as the sweep progresses from column to column, from left to right.

The number of columns in the intensity memory 50 may vary from as few as one to as many as the number of columns contained in the display and depends on considerations of component cost versus throughput and functionality. In the preferred embodiment, three columns were chosen so that brightness levels before and after the current column may be assigned based on variations in the spatial domain.

The 12-bit, high resolution intensity information must be converted to 2-bit, lower resolution brightness information for the display image. This conversion happens on the fly, such that only a few high resolution columns are needed. An adaptive process 100 operates on the higher resolution intensity information to produce brightness information at a lower resolution as an adaptive mapping process. Adaptive brightness mapping is necessary because modern display technology does not easily allow for brightness resolution extending much beyond eight bits (256 levels). Furthermore, the human eye does not respond to overly subtle variations in brightness and the lower brightness levels would likely be difficult to see, thus making extended brightness resolution in the display 36 unnecessary. In the preferred embodiment, the display 36 is implemented as a liquid crystal display (LCD) of which four levels of brightness are used including white, light gray, dark gray, and black. Other display technologies, including color displays, may be readily adapted to take advantage of the present invention because of the fundamental limitations in brightness resolution mentioned above.

The adaptive process 100 operates on one column at a time and maps the high resolution intensity information to lower-resolution brightness information according to a statistical analysis of the input signal. It is desirable to display predetermined portions of light gray, dark gray, and black pixels within a column in order to display enhanced image details. In the preferred embodiment, the predetermined portions among the light gray, dark gray, and black pixels are equal with the remaining white pixels remain where no pixels have been allocated. Other predetermined portions and distributions of brightness levels may also be chosen as desired. The equal distribution of pixel brightness levels is achieved by dynamically changing the intensity to brightness mapping based on the distribution of intensity levels within the intensity bins. The choice between using white pixels or black pixels for the remaining pixels is arbitrary and equally desirable.

Figure 8A:
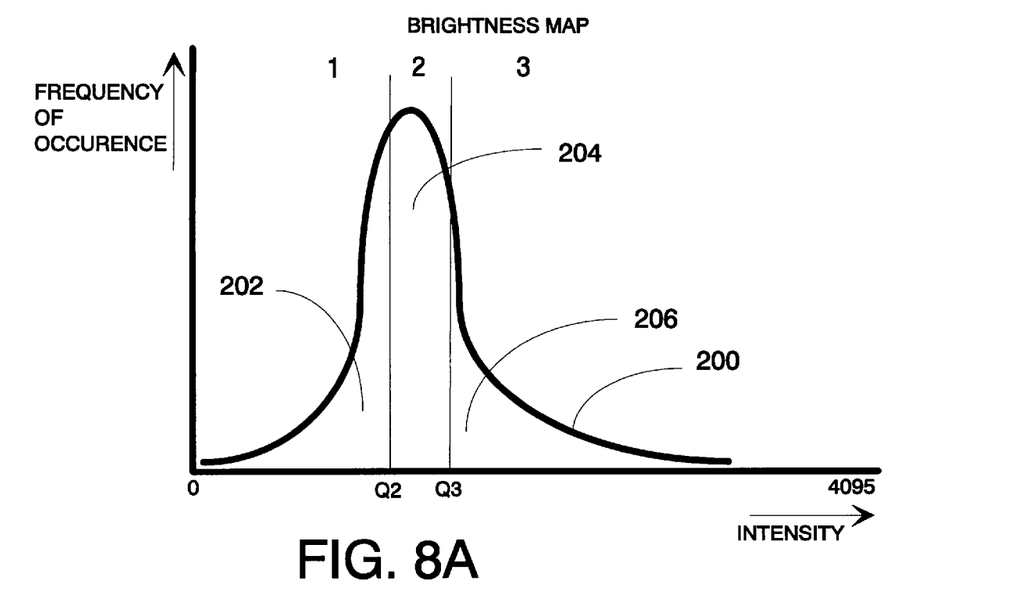
FIG. 8A and 8B are graphs that together illustrate the operation of the first adaptive process of FIG. 7 in adapting the intensity to brightness mapping according to the input signal.

Referring now to FIG. 8A (not to scale), there is shown an intensity to brightness level mapping with quantiles Q2 and Q3 having levels selected to providing equal areas 202, 204, and 206 under a curve 200. The fourth brightness level, for example the white brightness level, is the arbitrarily-chosen default level of the areas of the display 36 where there is no signal. The shape of the curve 200 represents the distribution of values contained in the intensity bits which may assume values from 0 to 4,095. The shape of the curve 200 is not important because the adaptive process 100 allocates the distribution of pixels solely on the area under the curve 200, whatever its shape. The areas 202, 204, and 206 are made equal by appropriate setting of the quantiles Q2 and Q3.

The curve 200 may represent the input signal 10 that contains a substantial amount of high frequency content such that the digital samples 40 are allocated across a relatively high number of different intensity bins, leaving the frequency of occurrence relatively low for any particular intensity bin. In this situation, it is desirable that the quantiles Q2 and Q3 be moved down lower in order to obtain enhanced image details. The high frequency content is more likely to be emphasized by being assigned to brightness level 1 or 2 while not masking out the low frequency content which is likely to be assigned to brightness level 3.

Figure 8B:
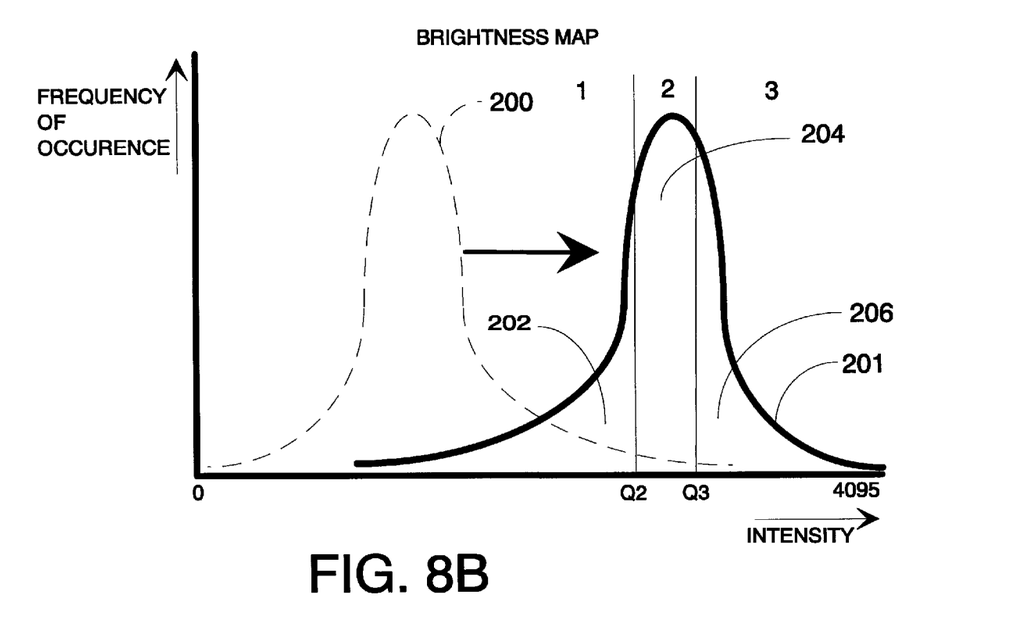

FIG. 8B shows how the adaptive process 100 reacts to a change in the intensity to brightness mapping based on a new column of intensity information. A curve 201 having a different shape from the curve 200 requires a new allocation and the quantiles Q2 and Q3 are adjusted to maintain the equality of the areas 202, 204, and 206.

The curve 201 is shifted from the curve 200 and may represent the input signal 10 that contains a substantial amount of low frequency content such that the digital samples 40 are allocated across a relatively low number of different intensity bins, leaving the frequency of occurrence relatively high for a particular set of intensity bins. In this situation, it is desirable that the quantiles Q2 and Q3 be moved up higher in order to obtain enhanced image details. Now, the low frequency content, while highly visible with brightness levels 2 or 3 does not mask out the remaining high frequency content which will likely be assigned brightness level 1. The adaptive process 100 thus provides a stream of present brightness values by column which are equally balanced by brightness level for the present column. By adaptively modifying the quantiles as discussed above, the mapping of the high-resolution brightness levels to the low-resolution intensity levels is possible without substantially compromising the visibility of the details of the composite image 22.

Referring back to FIG. 7, there is shown an adaptive process 102 which operates as an adaptive recombination process to combine each present brightness value with a past brightness value that is already in display 34 to obtain a new brightness value based on an indication of the past behavior of the input signal 10. Each new brightness value is coupled to the display memory 34. The display 36 is typically implemented as a display subsystem that reads the contents of the display memory 34 at a display rate that is independent of the sweep rate.

Recombination of present and past brightness values as performed by the adaptive process 102 is necessary because the high-resolution intensity data is not available over the full history of the past sweeps used to build the present display image. The adaptive process 102 extracts a composite indicator of the past temporal behavior of the input signal 10 from the pixel information stored in the display memory 34 and uses that composite indicator to generate a series of control states which govern how each present brightness value is combined with a corresponding past brightness value to obtain a new brightness value. Using the control state, an appropriate recombination algorithm is chosen which allows for displaying image details optimally where the display image is a composite of past and present brightness levels.

Figure 9:
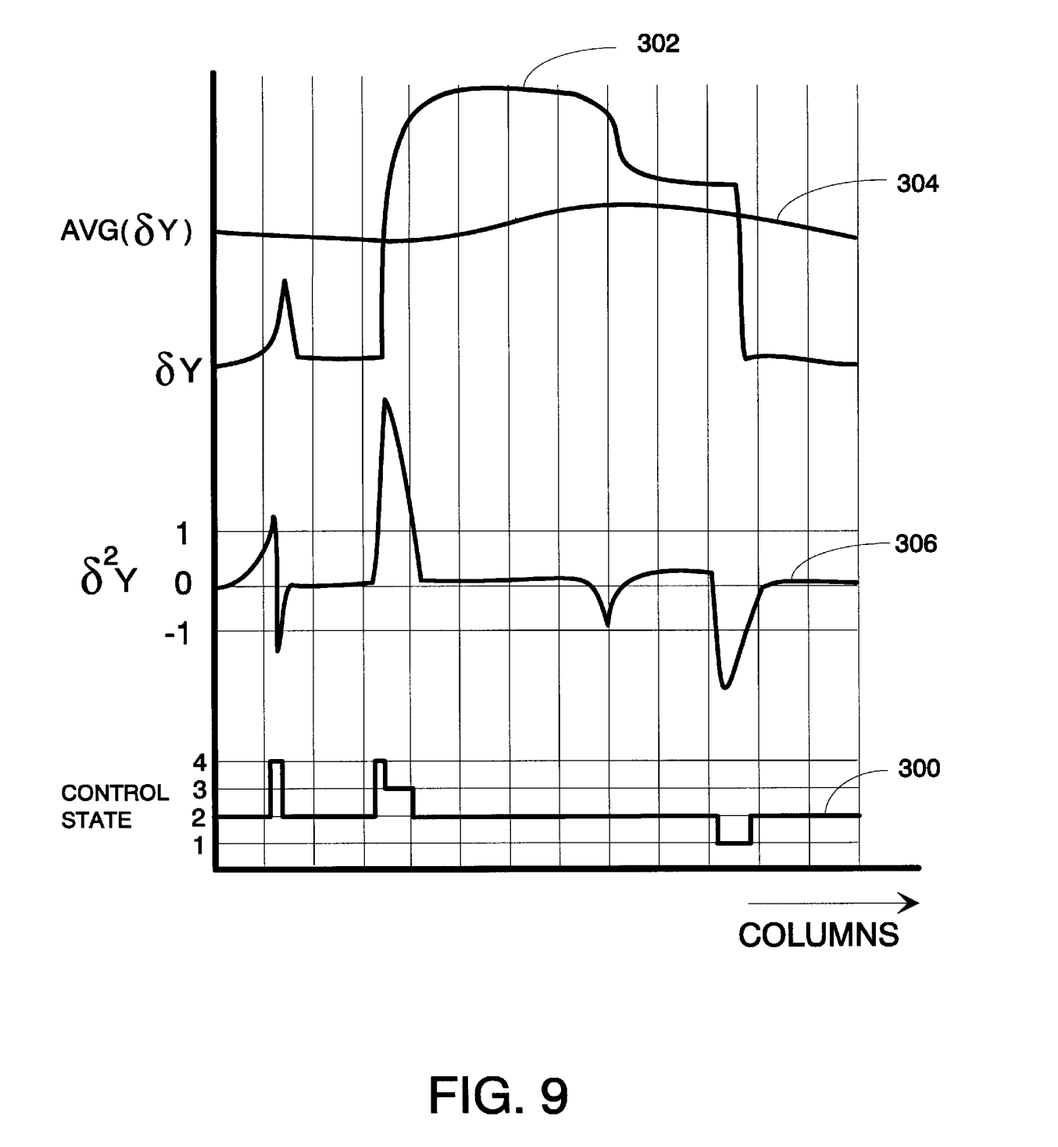
FIG. 9 is a graph that illustrates the operation of the second adaptive process of FIG. 7 in generating a series of control states.

Referring now to FIG. 9, there is shown a graph (not to scale) illustrating the operation of the adaptive process 102 in creating a control state 300 as a function of the brightness level information stored in the display memory 34 according to the present invention. Trace 302, labeled $\delta Y$, is the jump size within the actual column of the current sweep or the maximum difference betweeen row values of the intensity bins of the intensity memory 50. It may be desirable to smooth or low-pass filter the trace 302 in order to maintain a more stable composite indicator. Trace 304, labeled AVG ($\delta Y$) is a running average of the trace 302. The length used in the running average calculation is chosen to reflect an overall indication of the temporal behavior of the signal across a substantial number of columns. Trace 306, labeled $\delta^2 Y$, is the derivative of trace 302.

The control state 300 is created through the interaction of the traces 302, 304, and 306 and is chosen to have one of four possible states. State 2 is chosen whenever the derivative of trace 302, $\delta^2 Y$, is within a set of predetermined limits, which are arbitrarily labeled as +1 and −1 on the graph. When $\delta^2 Y$ is within the predetermined limits, the temporal behavior of the past brightness levels is defined to be stable. In this situation, the past and present brightness levels may be combined using a simple "OR" function in which the highest level of the past and present brightness levels is chosen as the new brightness level. Brightness level 3 is arbitrarily chosen as the highest level in the preferred embodiment corresponding to the black level.

A series of control states 300 may be used as the composite indicator to be used in determining how the past and present brightness values are to be combined according to a set of truth tables. States 1, 3, or 4 may be chosen when $\delta^2Y$ is greater than the predetermined limits, meaning that the temporal behavior of the past brightness levels is in transition and there is significant slope to the curvature of $\delta Y$. To choose between the states 1, 3, and 4, two variables are used. First, the polarity of $\delta^2Y$ is determined to be positive or negative. Second, $\delta Y$ is determined to be greater or smaller than AVG($\delta Y$). For example, in order to get to state 1, the polarity of $\delta^2Y$ is determined to be negative and $\delta Y$ is determined to be smaller than AVG($\delta Y$). This means there is presently too little emphasis on brightness values and that the past and present values should combined in a way so as to increase an emphasis on brightness in a way not allowed by a simple OR function.

To get to state 3, the polarity of $\delta^2Y$ is determined to be positive and $\delta Y$ is determined to be larger than AVG($\delta Y$). This means that there is presently too much emphasis on brightness values and the past and present values should be combined in a way so as to decrease an emphasis on intensity in a way not allowed by a simple OR function.

Similarly, to get to state 4, the polarity of $\delta^2Y$ is determined to be positive and $\delta Y$ is determined to be smaller than AVG($\delta Y$). This means that the past and present values should be combined in a way so as to decrease an emphasis on intensity in a way not allowed by a simple OR function. The following Control State Table summarizes the assignment of states 1 through 4 based on the determinations of the state of $\delta^2Y$ and of the value of $\delta Y$ with respect to AVG($\delta Y$) which is then used to obtain the appropriate truth table.

Control State Table

| $\delta^2Y$ | Value of $\delta Y$ with respect to AVG($\delta Y$) | |
|---|---|---|
| | Smaller | Larger |
| Negative | 1 | 2 |
| Positive | 4 | 3 |
| Constant ($|\delta^2Y| < 1$) | 2 | 2 |

The adaptive process 102 provides for the adaptivity in the brightness recombination between past and present brightness values by selection of the control state based on the past brightness information stored in the display memory. As a control state is selected for each brightness value based on the table above, the appropriate truth table, also referred to as a recombination algorithm, is selected. Referring now to FIG. 10A–D, there is shown a set of four truth tables that govern the result of the recombination between past and present brightness values.

Figure 10A:
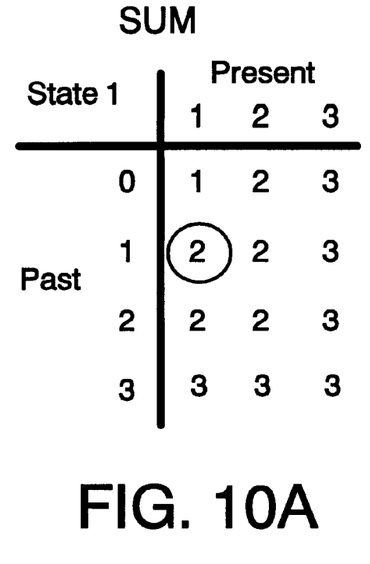
FIG. 10A–D together comprise a set of truth tables that are used to combine past and present brightness levels according to the control states shown in FIG. 9.
Figure 10B:
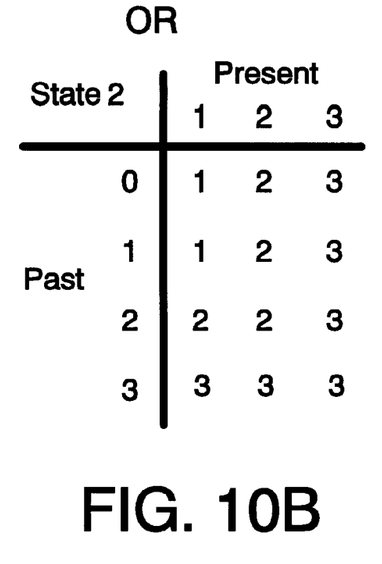

FIG. 10B is the truth table labeled OR corresponding to state 2. The logical OR function combines the present brightness value with the past brightness value by selecting the larger of the past and present brightness value to obtain the new brightness value. The OR function is most appropriate for combining past and present brightness information where the temporal behavior of the input signal is not substantially changing over multiple sweeps.

Figure 10C:
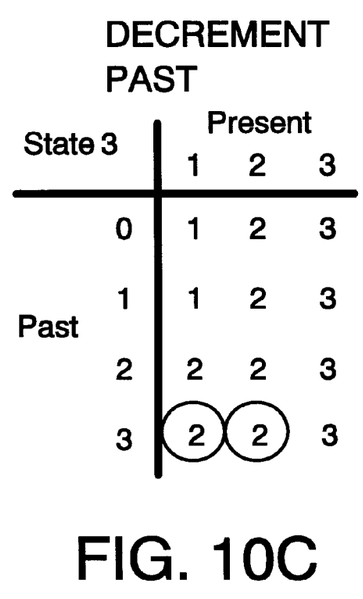
Figure 10D:
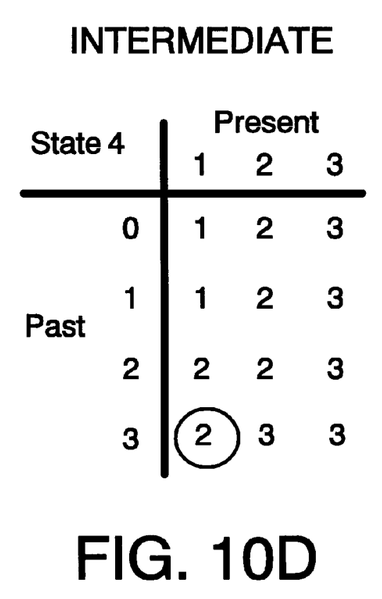

FIG. 10A, 10C, and 10D differ from the OR truth table of FIG. 10B according to the numbers that are circled. By selecting among the truth tables labeled OR, SUM, DECREMENT PAST, and INTERMEDIATE, an adaptive recombination based on the past temporal behavior of the input signal 10 is accomplished. The adaptive recombination is conducted in a manner which preserves as much as possible the image details when the brightness levels are changing over the various sweeps, meaning the temporal behavior of the input signal is changing. The relative change and rate of change of the past brightness information is captured by $\delta^2Y$ and the value of $\delta Y$ with respect to AVG($\delta Y$) used in the above table.

SUM is used when there is not enough emphasis on brightness levels. Brightness level 1 between past and present is assigned to a new brightness level 2. DECREMENT PAST is used when there is an overemphasis on intensity in the past brightness data. Past brightness information that is level 3 is decremented to level 2 to de-emphasize INTERMEDIATE is also chosen to de-emphasize past brightness levels but less severely than the DECREMENT PAST function. Other truth tables in addition to the OR, SUM, DECREMENT PAST, and INTERMEDIATE may readily be added to the set using a reasonable amount of experimentation to obtain an optimal recombination based on the particular characteristics of the input signal 10.

Recombination methods other than the selection of truth tables may be effectively employed, particularly when more brightness levels are being used with respect to the preferred embodiment, causing the sized of the truth tables to grow rapidly. In an alternative embodiment, a proportional method of recombination between past and present brightness levels may be employed. Instead of the discrete selection of truth tables, the past and present brightness levels may be combined proportionately according to a linear equation which has the composite indicator as an independent variable. Proportionate recombination may thus be appropriate where more numerous brightness levels are available or a greater amount of control over recombination is required.

It will be obvious to those having ordinary skill in the art that many changes may be made in the details of the above described preferred embodiments of the invention without departing from the spirit of the invention in its broader aspects. For example, the adaptive recombination of old and new brightness values may be performed in multiple dimensions, for example with brightness and with color, in substantially the same manner as above. As explained above, the present invention may be readily adapted for greater or fewer brightness levels. Therefore, the scope of the present invention should be determined by the following claims.

What we claim as our invention is:

1. In a raster display device, an apparatus for improving display image details, comprising:
   (a) an intensity memory having a row and column arrangement for receiving and storing intensity information over a plurality of sweeps; and
   (b) an adaptive mapping process coupled to said intensity memory for converting said intensity information into present brightness levels from a set of brightness levels having less resolution than said intensity information wherein said adaptive mapping process produces predetermined portions of each of said brightness levels from said set of brightness levels within each of said columns.

2. An apparatus for improving display image details according to claim 1 further comprising:
   (a) a display memory for storing said present brightness values according to said row and column arrangement; and
   (b) a raster display having a matrix of pixels according to said row and column arrangement coupled to said display memory for receiving said present brightness values and displaying said display image.

3. An apparatus for improving display image details according to claim 2 further comprising an adaptive recombination process interposed between said adaptive process and said display memory for receiving said present brightness values from said adaptive mapping process and past brightness values from said display memory wherein said adaptive recombination process combines said past and present brightness values according to a composite indicator responsive to said past brightness values to produce new brightness values to be stored in said display memory.

4. An apparatus for improving display image details according to claim 3 wherein said composite indicator comprises a series of control states.

5. An apparatus for improving display image details according to claim 4 wherein said adaptive recombination process combines said past brightness values and said present brightness values according to a selected truth table from a set of truth tables responsive to said series of control states.

6. An apparatus for improving display image details according to claim 5 wherein said set of truth tables comprises OR, SUM, DECREMENT PAST, and INTERMEDIATE.

7. An apparatus for improving display image details according to claim 3 wherein said adaptive recombination process combines said past and present brightness values in a proportional manner according to said composite indicator.

8. An apparatus for improving display image details according to claim 1 wherein said intensity information is interpolated from digital samples.

9. An apparatus for improving display image details according to claim 2 wherein said adaptive mapping process maps equal numbers of each of said brightness levels from said set of brightness levels within each of said columns.

10. An apparatus for improving display image details according to claim 1 wherein said adaptive mapping process maps said intensity information to said set of brightness levels according to a set of quantiles.

11. An apparatus for improving display image details according to claim 1 wherein said intensity memory stores each of said intensity values with a resolution of 4,096 levels.

12. An apparatus for improving display image details according to claim 2 wherein said display memory stores each of said brightness levels with a resolution of four levels.

13. A raster display device for displaying a display image with improved details, comprising:
(a) an intensity memory having a row and column arrangement for receiving and storing intensity information over each sweep;
(b) an adaptive mapping process coupled to said intensity memory for receiving and converting said intensity information into present brightness levels from a set of brightness levels wherein said set of brightness levels has less resolution than said intensity information and said adaptive mapping process produces predetermined portions of each of said brightness levels from said set of brightness levels within each of said columns;
(c) a display memory for storing said present brightness values according to said row and column arrangement; and
(d) a raster display having a matrix of pixels according to said row and column arrangement coupled to said display memory for receiving said brightness values and displaying said display image developed over at least one of said sweeps.

14. A raster display device according to claim 13 further comprising an adaptive recombination process interposed between said adaptive process and said display memory for receiving said present brightness values from said adaptive mapping process and past brightness values from said display memory wherein said adaptive recombination process combines said past and present brightness values according to a composite indicator responsive to said past brightness values to produce new brightness values to be stored in said display memory.

15. A raster display device according to claim 14 wherein said composite indicator comprises a series of control states.

16. A raster display device according to claim 15 wherein said adaptive recombination process combines said past brightness values and said present brightness values according to a selected truth table from a set of truth tables responsive to said series of control states.

17. A raster display device according to claim 16 wherein said set of truth tables comprises OR, SUM, DECREMENT PAST, and INTERMEDIATE.

18. A raster display device according to claim 14 wherein said adaptive recombination process combines said past and present brightness values in a proportional manner responsive to said composite indicator.

19. A raster display device according to claim 13 wherein said intensity information is interpolated from digital samples.

20. A raster display device according to claim 13 wherein said adaptive mapping process maps equal numbers of each of said brightness levels from said set of brightness levels within each of said columns.

21. A raster display device according to claim 13 wherein said adaptive mapping process maps said intensity information to said set of brightness levels according to a set of quantiles.

22. A raster display device according to claim 13 wherein said intensity memory stores each of said intensity values with a resolution of 4,096 levels.

23. A raster display device according to claim 13 wherein said display memory stores each of said brightness levels with a resolution of four levels.

24. In a raster display device, a method for displaying a display image with improved details, comprising:
(a) storing intensity information in a row and column arrangement in an intensity memory during each of a plurality of sweeps; and
(b) adaptively converting said intensity information into present brightness values, said present brightness levels having lower resolution than said intensity information, wherein predetermined portions of each of said brightness levels from said set of brightness levels are produced within each of said columns.

25. A method for displaying a display image with improved details according to claim 24 further comprising:
(a) storing said present brightness values in a display memory according to said row and column arrangement; and
(b) displaying said display image on a raster display having a matrix of pixels corresponding to said row and column arrangement responsive to said present brightness values received from said display memory.

26. A method for displaying a display image with improved details according to claim 24 further comprising adaptively recombining said brightness values with past brightness values from said display memory according to a composite indicator responsive to said past brightness values to produce new brightness values to be stored in said display memory.

27. A method for displaying a display image with improved details according to claim 26 further comprising generating a series of control states according to said composite indicator.

28. A method for displaying a display image with improved details according to claim 27 further comprising combining said past and present brightness values according to a selected truth table from a set of truth tables responsive to said series of control states.

29. A method for displaying a display image with improved details according to claim 28 wherein said set of truth tables comprises OR, SUM, DECREMENT PAST, and INTERMEDIATE.

30. A method for displaying a display image with improved details according to claim 26 further comprising adaptively recombining said past and present brightness values in a proportional manner responsive to said composite indicator.

31. A method for displaying a display image with improved details according to claim 24 further comprising interpolating said intensity information from digital samples.

32. A method for displaying a display image with improved details according to claim 24 wherein said predetermined portions of each of said brightness levels within each of said columns are equal.

33. A method for displaying a display image with improved details according to claim 24 further comprising adaptively mapping said intensity information to said set of brightness levels according to a set of quantiles.

* * * * *